US007320919B2

(12) United States Patent
Kim

(10) Patent No.: US 7,320,919 B2

(45) Date of Patent: Jan. 22, 2008

(54) METHOD FOR FABRICATING SEMICONDUCTOR DEVICE WITH METAL-POLYCIDE GATE AND RECESSED CHANNEL

(75) Inventor: Tae Kyun Kim, Yongin-si (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 32 days.

(21) Appl. No.: 11/450,789

(22) Filed: Jun. 9, 2006

(65) Prior Publication Data

US 2007/0117294 A1 May 24, 2007

(30) Foreign Application Priority Data

Nov. 22, 2005 (KR) ..................... 10-2005-0111549

(51) Int. Cl.
*H01L 21/336* (2006.01)

(52) U.S. Cl. .............................. 438/282; 257/E21.655

(58) Field of Classification Search .................. 438/76, 438/146, 175, 270, 282; 257/E21.655
See application file for complete search history.

(56) References Cited

U.S. PATENT DOCUMENTS 5,371,024 A * 12/1994 Hieda et al. ................ 438/291
5,668,394 A 9/1997 Lur et al. ................... 257/413
2005/0042833 A1* 2/2005 Park et al. .................. 438/282
2005/0054163 A1* 3/2005 Kim et al. .................. 438/282
2007/0117364 A1* 5/2007 Kim ........................... 438/592

* cited by examiner

*Primary Examiner*—W. David Coleman
(74) *Attorney, Agent, or Firm*—Marshall, Gerstein & Borun LLP

(57) ABSTRACT

A method for fabricating a semiconductor device with a metal-polycide gate and a recessed channel, including the steps of: forming trenches for a recessed channel in an active area of a semiconductor substrate; forming a gate insulating layer on the semiconductor substrate having the trenches; forming a gate conductive layer on the entire surface of the resulting structure so that the trenches are buried; forming a silicon-rich amorphous metal silicide layer and a gate hard mask on the gate conductive layer; etching the resulting structure until upper portions of the gate conductive layer are removed by a predetermined thickness, upon first patterning for gate stacks, and forming a metal layer on the entire surface of the resulting structure; forming lateral metal capping layers on sides of the silicon-rich amorphous metal silicide layer by blanket etching, completing formation of gate stacks; and thermally processing the silicon-rich amorphous metal silicide layer to form a crystallized metal silicide layer.

7 Claims, 8 Drawing Sheets

METHOD FOR FABRICATING SEMICONDUCTOR DEVICE WITH METAL-POLYCIDE GATE AND RECESSED CHANNEL

BACKGROUND OF THE INVENTION

1. Field of the Invention

The invention relates generally to a method for fabricating a semiconductor device and, more particularly, to a method for fabricating a semiconductor device with a metal-polycide gate and a recessed channel.

2. Description of the Related Art

With drastic decreases in the design rule of integrated circuit semiconductor devices to a level of 70 nm or less, the gate resistance of cell transistors has greatly increased and the channel length of cell transistors has markedly decreased. Accordingly, planar transistor structures suffer from limitations in the realization of their gate resistance and threshold voltage. Under such circumstances, a great deal of research has been recently conducted on methods for ensuring a longer channel length without any increase in design rule. Particularly, studies are actively being undertaken on structures that have an extended channel length while maintaining a limited gate linewidth, for example, semiconductor devices having a recessed channel whose effective channel length is extended by recessing a semiconductor substrate and employing the recessed region as a gate structure.

FIGS. 1 to 8 are cross-sectional views illustrating a method for fabricating a conventional semiconductor device with a recessed channel.

With reference first to FIG. 1, a pad oxide layer 111' and a pad nitride layer 112' are sequentially formed on a semiconductor substrate 100 to form a hard mask 110'. As shown in FIG. 2, portions of the surface of the semiconductor substrate 100, particularly isolation regions, are exposed by a common patterning process, leaving a hard mask pattern 110. The hard mask pattern 110 has a structure in which a pad oxide layer pattern 111 and a pad nitride layer pattern 112 are sequentially deposited. Subsequently, etching is conducted using the hard mask pattern 110 as an etching barrier layer to etch the exposed portions of the semiconductor substrate 100 to a predetermined depth to form trenches 120 for isolation defining an active area 101.

Next, as shown in FIG. 3, a buried insulating layer is deposited on the entire surface of the resulting structure, followed by planarization to form trench isolation layers 122. Then, the hard mask pattern (110 of FIG. 2) is removed. As shown in FIG. 4, a buffer oxide layer 114 is formed on the entire surface of the semiconductor substrate, followed by impurity ion implantation for control of threshold voltage and formation of well/channel. Thereafter, the buffer oxide layer 114 is removed. As shown in FIG. 5, a hard mask 130 formed of an oxide layer 131 and a polysilicon layer 132 is formed on the semiconductor substrate 100. As shown in FIG. 6, a line-shaped photoresist pattern (not shown) is used to form a hard mask pattern (not shown) through which recessed region of the semiconductor substrate 100 is exposed. Subsequently, etching is conducted using the hard mask pattern as an etching barrier layer to etch portions of the semiconductor substrate 100 to a predetermined depth to form trenches 140 for a recessed channel. Then, the hard mask pattern is removed.

As shown in FIG. 7, a gate oxide layer 150 is formed on the entire surface of the semiconductor substrate, and then a polysilicon layer 160, a silicon-rich tungsten silicide layer 170 and a gate hard mask 180 are formed thereon in this order. As shown in FIG. 8, exposed portions of the gate hard mask 180, the silicon-rich tungsten silicide layer 170, the polysilicon layer 160 and the gate oxide layer 150 are removed in this order, leaving gate stacks 190.

In the method for the fabrication of a semiconductor device having a tungsten-polycide gate and a recessed channel, the deposition of the tungsten silicide layer 170 constituting the tungsten-polycide gate is generally achieved by chemical vapor deposition (CVD) using $WF_6$ and silane ($SiH_4$) as source gases. In this case, the silicon-rich tungsten silicide ($WSi_x$) layer 170 is deposited by relatively increasing the flow rate of silane during CVD. At this time, since excess silicon atoms are used to form an additional silicon layer on the polysilicon layer 160, the finally crystallized tungsten silicide ($WSi_2$) layer is relatively thinner than the initially deposited amorphous tungsten silicide ($WSi_x$) layer, which causes an increase in the resistance of word lines.

In the case where a tungsten-rich tungsten silicide layer is formed instead of the silicon-rich tungsten silicide layer, a reduction in word line resistance can be induced. Specifically, when the flow rate of $WF_6$ introduced into a chamber is increased, a tungsten (W)-rich tungsten silicide layer is formed. The finally crystallized tungsten silicide ($WSi_2$) layer thus formed is relatively thicker than the initially deposited amorphous tungsten silicide ($WSi_x$) layer. The reason for this difference in thickness is that excess tungsten (W) atoms present within the amorphous tungsten silicide layer ($WSi_x$) react with polysilicon present within the underlying polysilicon layer during formation of the tungsten silicide ($WSi_2$) layer by crystallization to form an additional tungsten silicide layer. Accordingly, an increase in the volume of the tungsten silicide layer included in the gate stacks can induce a reduction in word line resistance.

However, the content of fluorine (F) components within the amorphous tungsten silicide ($WSi_x$) layer is increased due to the use of the excess $WF_6$ gas, which increases the electrical thickness of the gate oxide layer 150 and causes poor characteristics (e.g., gate oxide integrity (GOI)). Therefore, the method causes many problems in practical applications.

GENERAL DESCRIPTION OF THE INVENTION

The invention provides a method for fabricating a semiconductor device with a metal-polycide gate and a recessed channel wherein the metal-polycide gate structure is formed by depositing a silicon-rich amorphous metal silicide layer without any increase in word line resistance.

In accordance with one aspect, the invention provides a method for fabricating a semiconductor device with a metal-polycide gate and a recessed channel, the method including the steps of:

forming trenches for a recessed channel in an active area of a semiconductor substrate;

forming a gate insulating layer on the semiconductor substrate having the trenches;

forming a gate conductive layer on the entire surface of the resulting structure so that the trenches are buried;

sequentially forming a silicon-rich amorphous metal silicide layer and a gate hard mask on the gate conductive layer;

patterning the gate hard mask and the silicon-rich amorphous metal silicide layer until upper portions of the gate conductive layer are removed by a predetermined thickness;

forming a metal layer on the entire surface of the patterned structure;

blanket etching the metal layer to remove portions of the metal layer and to sequentially remove exposed portions of the gate conductive layer and exposed portions of the gate insulating layer, leaving lateral metal capping layers on sides of the silicon-rich amorphous metal silicide layer and forming patterned gate stacks; and thermally processing the silicon-rich amorphous metal silicide layer constituting the gate stacks to form a crystallized metal silicide layer.

The trenches for a recessed channel preferably have a depth of 1,000 Å to 1,500 Å.

It is preferred that the gate insulating layer be formed to have a thickness of 30 Å to 50 Å, the gate conductive layer be formed of a polysilicon layer having a thickness of 500 Å to 1,000 Å, the silicon-rich amorphous metal silicide layer be formed of a silicon-rich amorphous tungsten silicide layer having a thickness of 1,000 Å to 1,300 Å, and the gate hard mask be formed to have a thickness of 2,000 Å to 2,500 Å.

The upper portions of the gate conductive layer are preferably removed by a thickness of 100 Å to 300 Å when the gate hard mask and the silicon-rich amorphous metal silicide layer are patterned.

The metal layer is preferably formed of a tungsten thin layer having a thickness of 50 Å to 100 Å.

The thermal processing is preferably conducted by a rapid thermal process.

The rapid thermal process is preferably carried out in a nitrogen ($N_2$) atmosphere at 700° C. to 1,000° C.

BRIEF DESCRIPTION OF THE DRAWINGS

The invention will be more clearly understood from the following detailed description taken in conjunction with the accompanying drawings, in which.

DESCRIPTION OF THE PREFERRED EMBODIMENTS

Preferred embodiments of the invention will be described in detail with reference to the accompanying drawings. However, various variations and modifications can be made in the embodiments and the invention is not to be construed as limited to the following embodiments.

FIGS. 9 to 17 are cross-sectional views illustrating a method for fabricating a semiconductor device with a tungsten-polycide gate and a recessed channel according to the invention.

Figure 9:
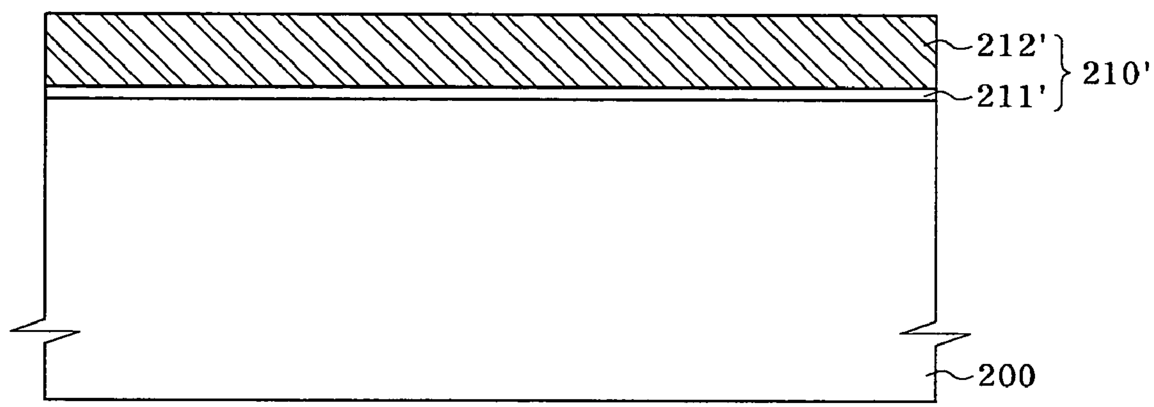
FIGS. 9 to 17 are cross-sectional views illustrating a method for fabricating a semiconductor device with a tungsten-polycide gate and a recessed channel according to the invention.

With reference first to FIG. 9, a pad oxide layer 211' and a pad nitride layer 212' are sequentially formed on a semiconductor substrate 200 to form a hard mask 210' for the formation of trenches for isolation. The pad oxide layer 211' is illustratively formed to have a thickness of about 50 Å to about 150 Å, and the pad nitride layer 212' is illustratively formed to have a thickness of about 500 Å to about 1,000 Å.

Figure 10:
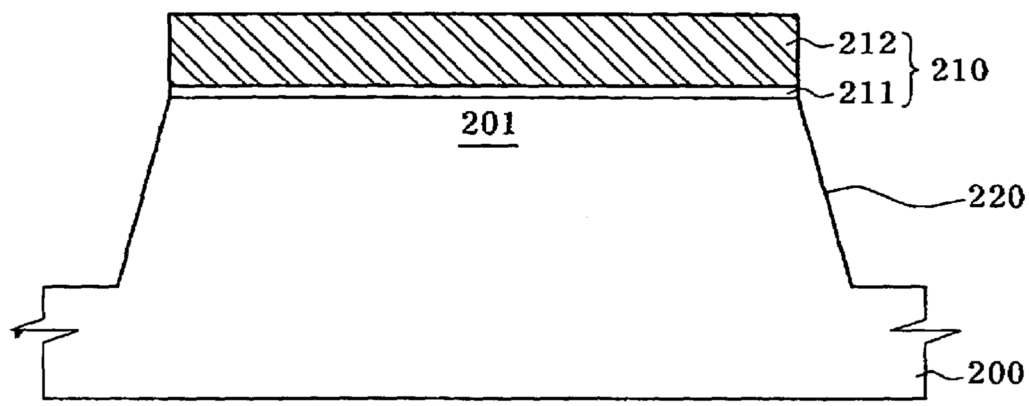
Figure 11:
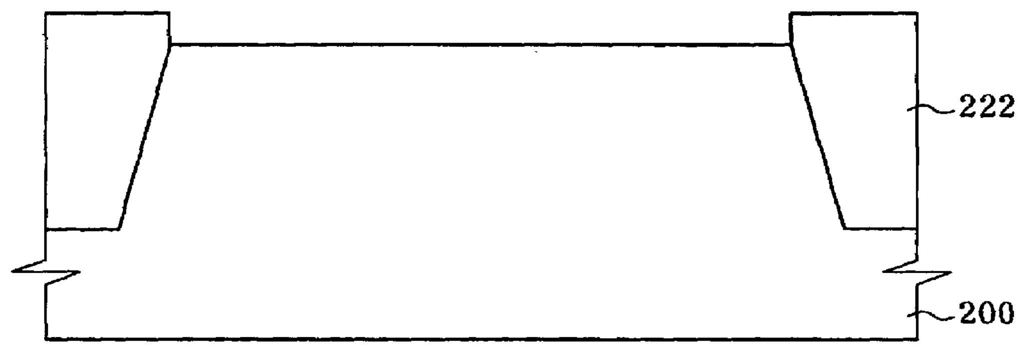

Referring to FIG. 10, portions of the surface of the semiconductor substrate 200, particularly isolation regions, are exposed by a common patterning process, leaving a hard mask pattern 210. The hard mask pattern 210 has a structure in which a pad oxide layer pattern 211 and a pad nitride layer pattern 212 are sequentially deposited. Subsequently, etching is conducted using the hard mask pattern 210 as an etching barrier layer to etch the exposed portions of the semiconductor substrate 200 to a predetermined depth to form trenches 220 for isolation defining an active area 201. The trenches 220 thus formed have a depth of about 2,000 Å to about 3,000 Å.

Figure 1:
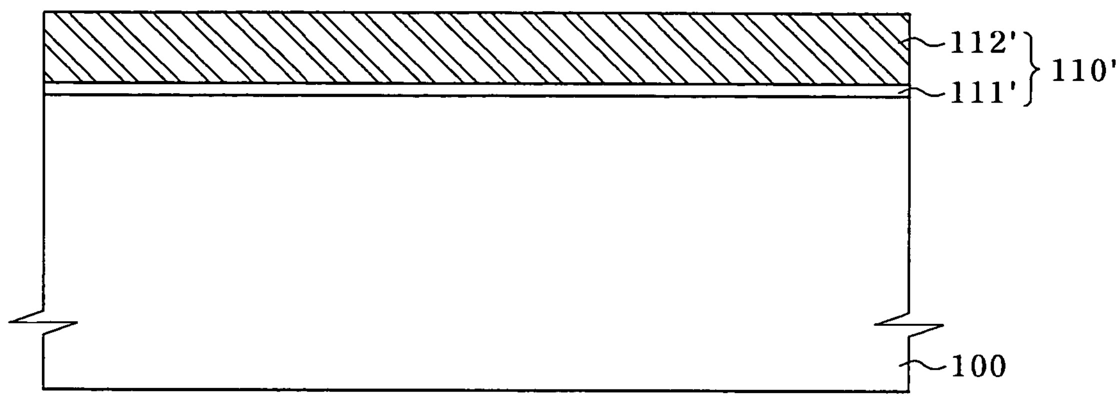
FIGS. 1 to 8 are cross-sectional views illustrating a method for fabricating a conventional semiconductor device with a recessed channel.
Figure 2:
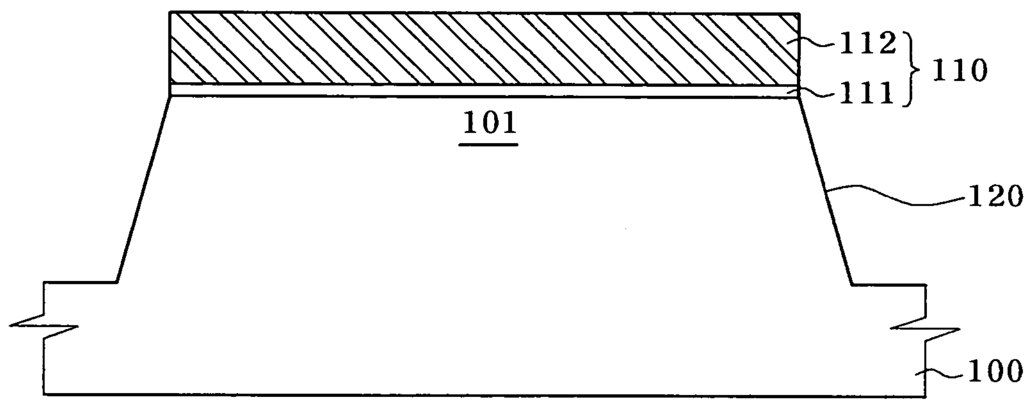
Figure 3:
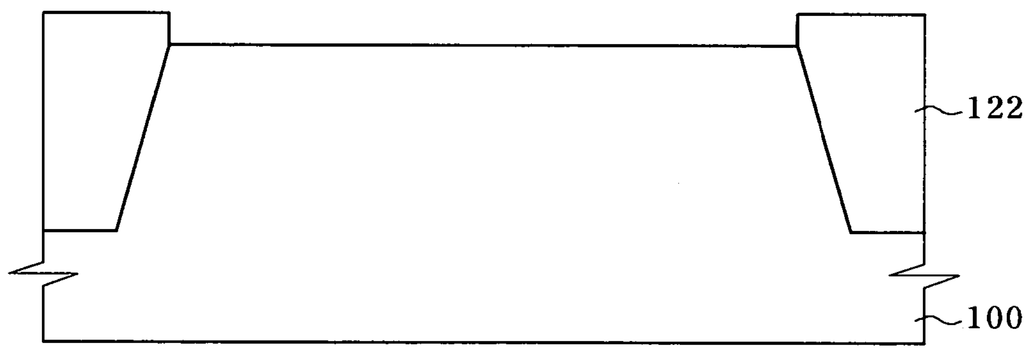
Figure 4:
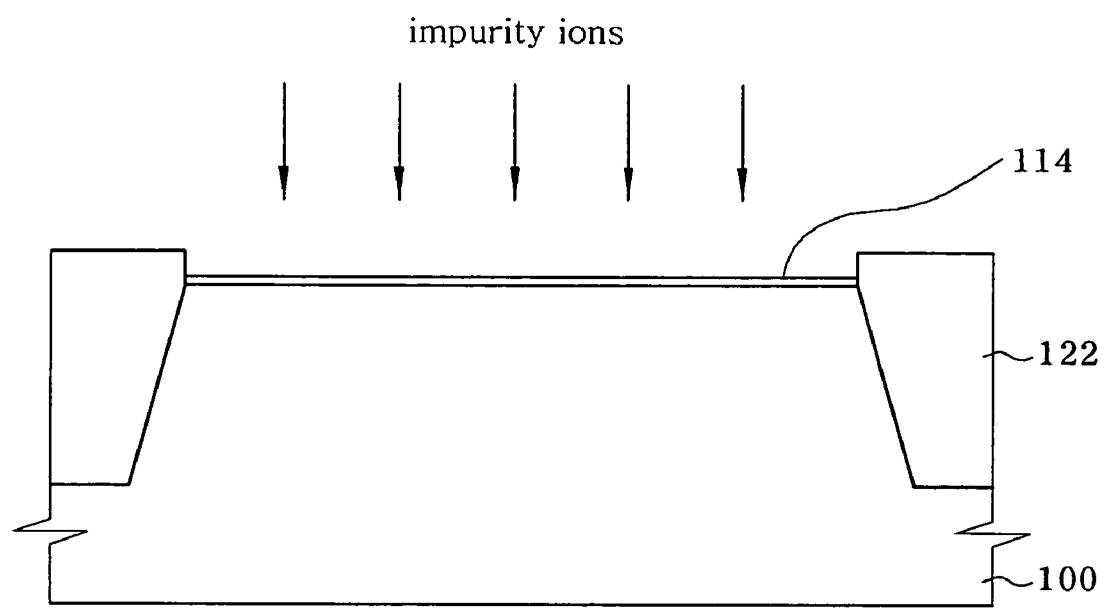
Figure 5:
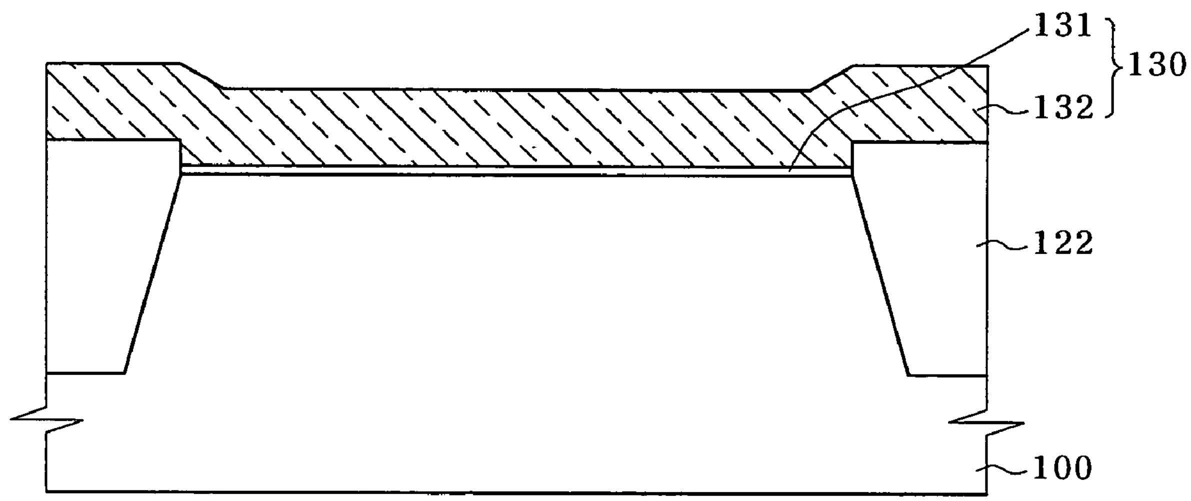
Figure 6:
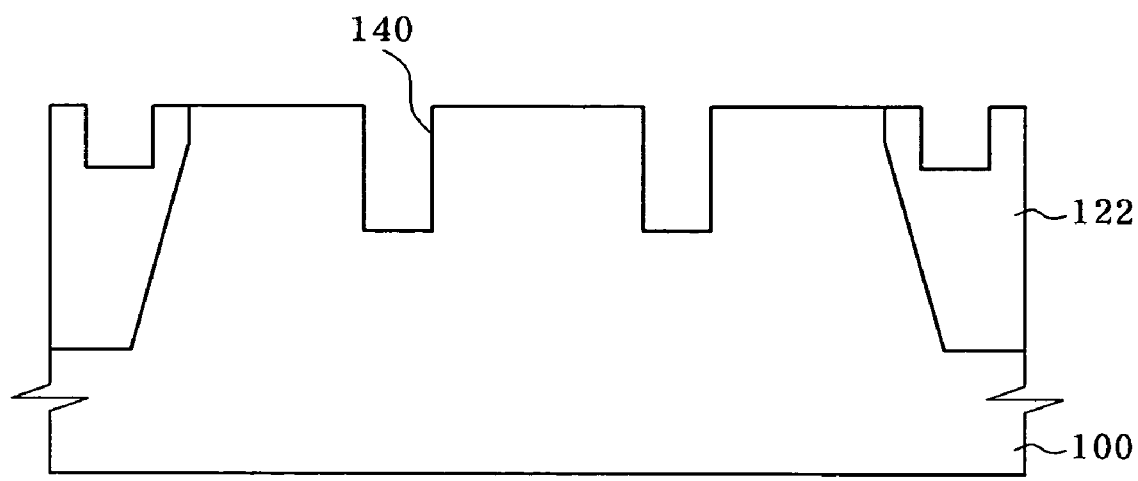
Figure 7:
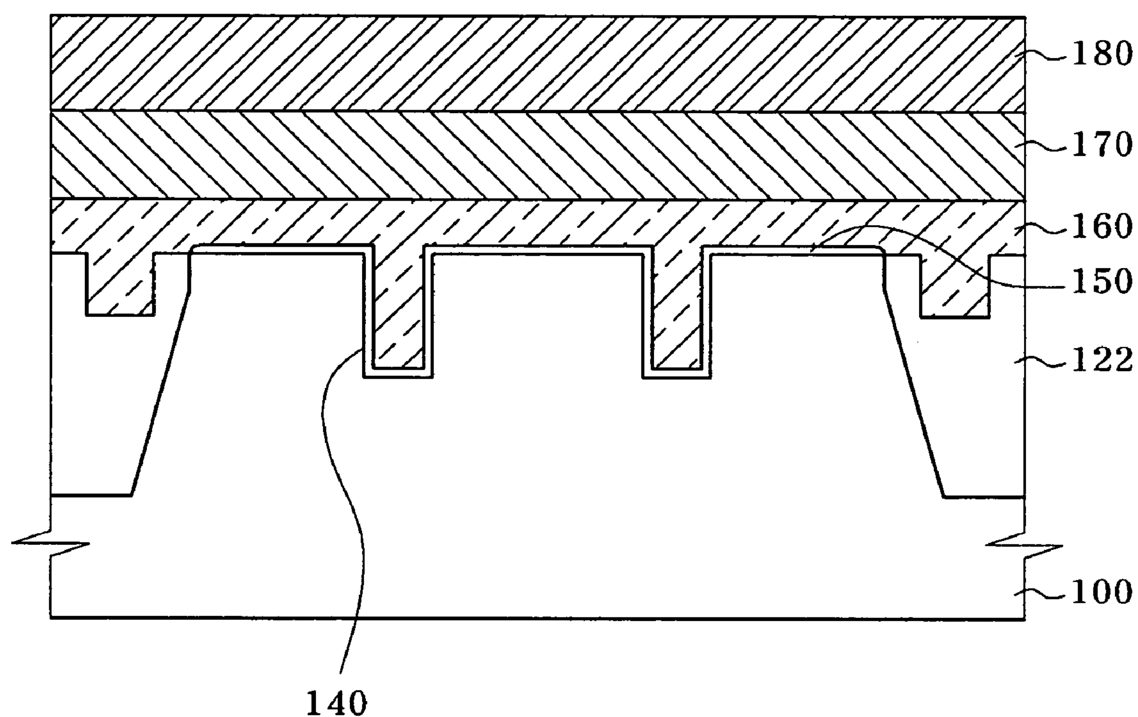
Figure 8:
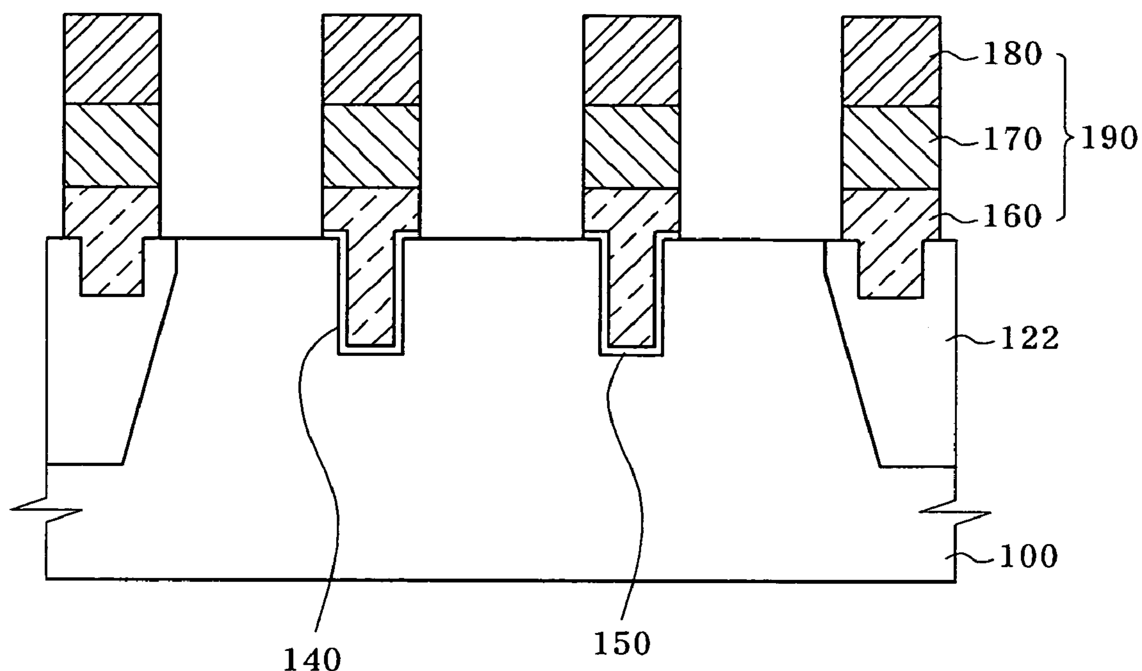

Referring to FIG. 1, a buried insulating layer is deposited on the entire surface of the resulting structure so that the inside of the trenches 220 is buried, followed by planarization, e.g., by chemical mechanical planarization (CMP), to form trench isolation layers 222. This planarization is conducted in such a manner that the surface of the hard mask pattern 210 is exposed. Before formation of the buried insulating layer, if necessary, a sidewall oxide layer, a liner nitride layer and a liner oxide layer may be formed in this order on each of the trenches 220. After formation of the trench isolation layers 222, the hard mask pattern 210 is removed.

Figure 12:
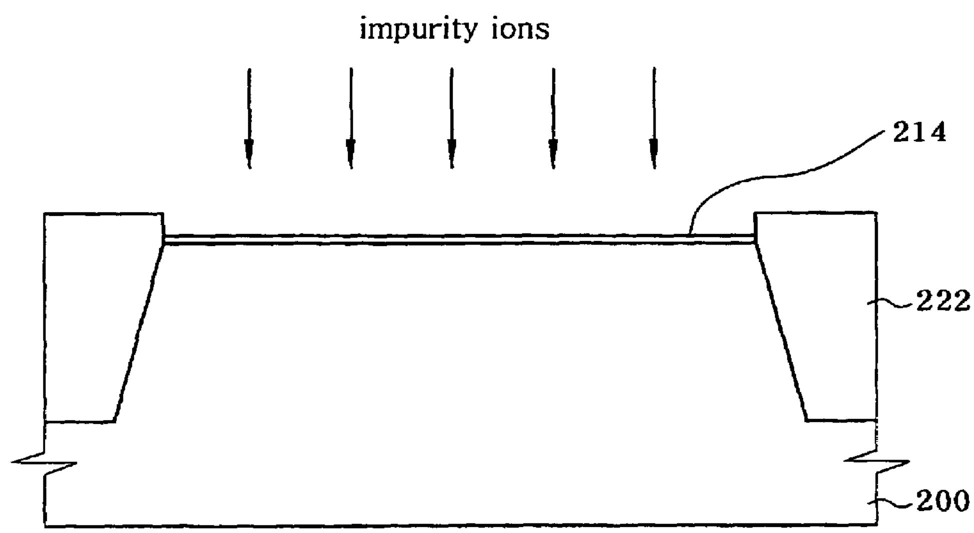

Referring to FIG. 12, a buffer oxide layer 214 for ion implantation is formed on the entire surface of the semiconductor substrate. As indicated by the arrows in the figure, a common impurity ion implantation process for control of threshold voltage and the formation of well/channel are carried out. Optionally, the impurity ion implantation processes may be performed in a subsequent step. After completion of the impurity ion implantation, the buffer oxide layer 214 is removed.

Figure 13:
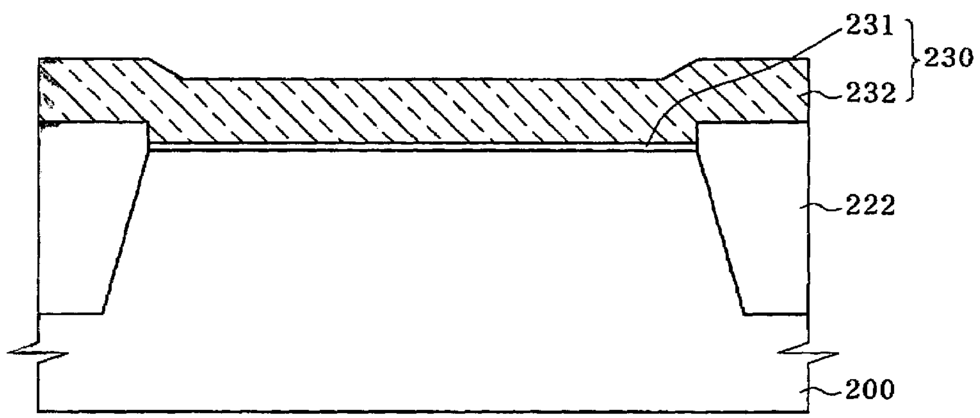

Referring to FIG. 13, a hard mask 230 formed of an oxide layer 231 and a polysilicon layer 232 is formed on the semiconductor substrate 200. The hard mask 230 provides regions where trenches for a recessed channel are formed. If needed, other layers may be used instead of the polysilicon layer 232. The oxide layer 231 is illustratively formed to have a thickness of about 50 Å to about 100 Å, and the polysilicon layer 232 is illustratively formed to have a thickness of about 500 Å to 1,000 Å.

Figure 14:
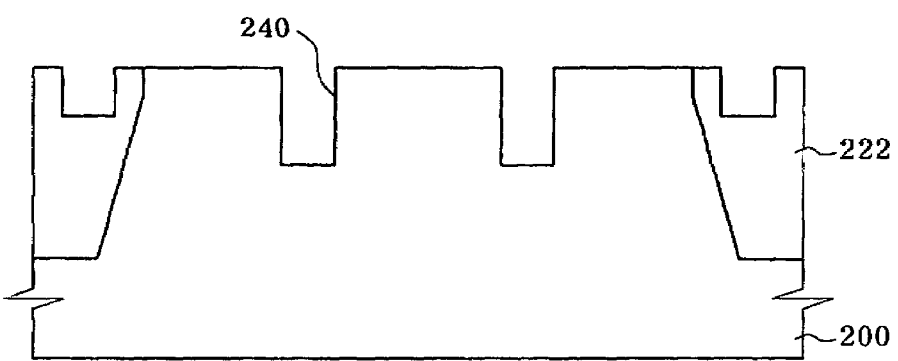

Referring to FIG. 14, a line-shaped photoresist pattern (not shown) is used to form a hard mask pattern (not shown), through which portions of the surface of the semiconductor substrate 200 are exposed to form trenches for a recessed channel. Subsequently, etching is conducted using the hard mask pattern as an etching barrier layer to etch portions of the semiconductor substrate 200 to a predetermined depth to form trenches 240 for a recessed channel. Then, the hard mask pattern is removed. The trenches 240 for a recessed channel are illustratively formed to have a depth of about 1,000 Å to about 1,500 Å.

Figure 15:
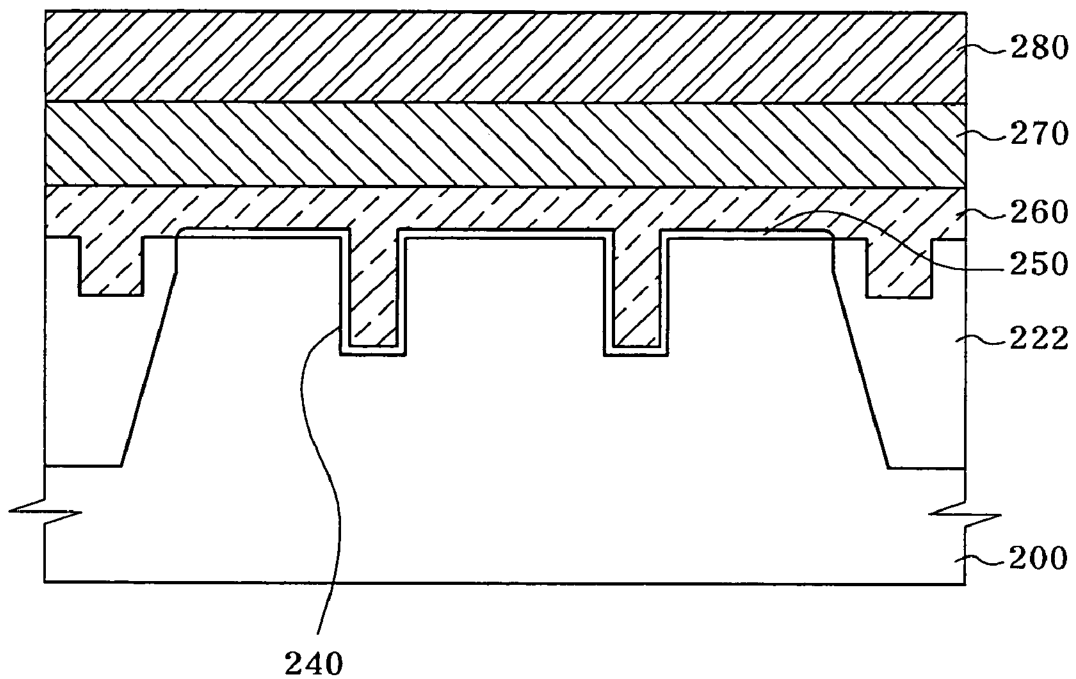

Referring to FIG. 15, a gate oxide layer 250, acting as a gate insulating layer, is formed on the surface of the semiconductor substrate 200 on which the trenches 240 for a recessed channel are formed. The gate oxide layer 250 is illustratively formed to have a thickness of about 30 Å to about 50 Å. Then, a polysilicon layer 260 doped with dopants is formed on the entire surface of the resulting structure so that the trenches 240 are buried. The polysilicon layer 260 is illustratively formed to have a thickness of about 500 Å to about 1,000 Å. Then, a silicon-rich amorphous tungsten silicide ($WSi_x$) layer 270 is formed on the polysilicon layer 260. The silicon-rich amorphous tungsten silicide ($WSi_x$) layer 270 is illustratively formed to have a thickness of about 1,000 Å to about 1,300 Å by chemical vapor deposition (CVD). Then, a gate hard mask 280 is formed on the silicon-rich amorphous tungsten silicide ($WSi_x$) layer 270. The gate hard mask 280 may be formed of a nitride layer having a thickness of about 2,000 Å to about 2,500 Å.

Figure 16:
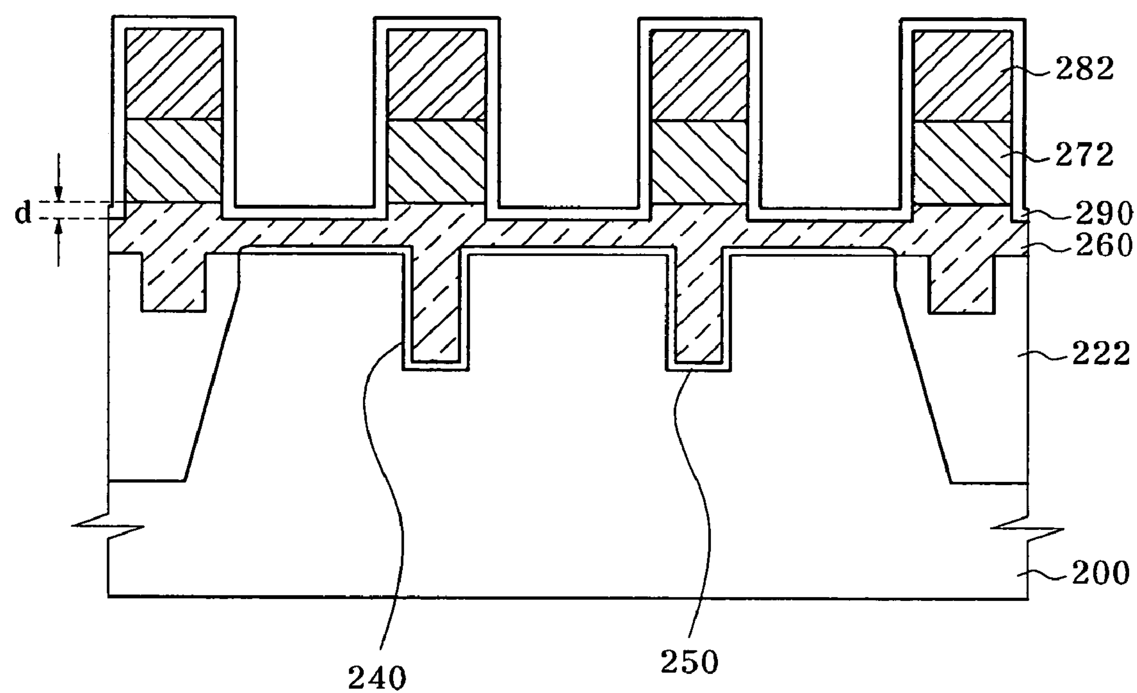

Referring to FIG. 16, a common patterning process, e.g., etching using a photoresist layer pattern for the formation of a gate, is carried out to sequentially remove portions of the gate hard mask 280 and portions of the silicon-rich amorphous tungsten silicide ($WSi_x$) layer 270. At this time, upper portions of the polysilicon layer 260 are also removed by a predetermined thickness (d), e.g., about 100 Å to about 300 Å. As a result, structures are formed wherein a silicon-rich amorphous tungsten silicide ($WSi_x$) layer pattern 272 and a gate hard mask pattern 282 are sequentially formed on the polysilicon layer 260 whose upper portions are removed by the thickness (d). Then, a tungsten (W) thin layer 290 is illustratively formed to have a thickness of about 50 Å to about 100 Å on the entire surface of the resulting structure.

Figure 17:
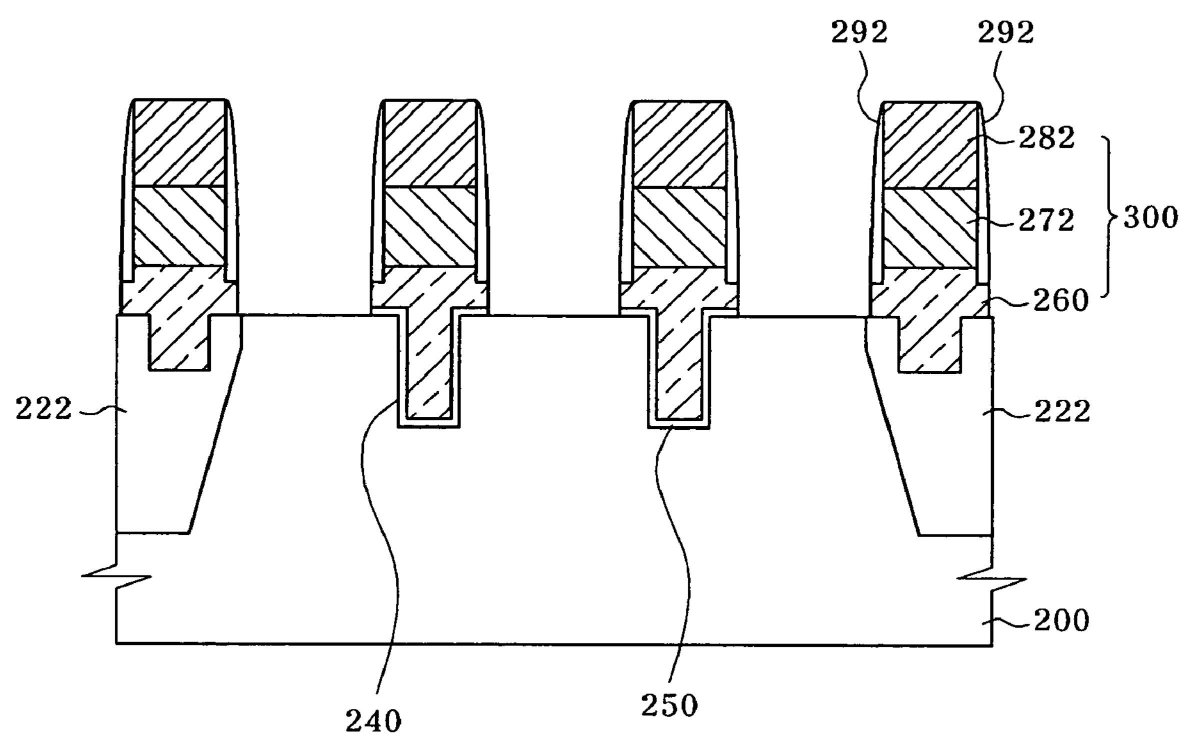

Referring to FIG. 17, the surface of the semiconductor substrate 200 is exposed by blanket etching to form final gate stacks 300. During the blanket etching, portions of the tungsten thin layer 290 are removed to leave lateral tungsten capping layers 292 on sides of the silicon-rich amorphous tungsten silicide ($WSi_x$) layer pattern 272, and the polysilicon layer 260 is patterned.

After formation of the gate stacks 300, a rapid thermal process (RTP) is carried out illustratively in a nitrogen ($N_2$) atmosphere at about 700° C. to about 1,000° C. As a result of the rapid thermal process, the silicon-rich amorphous tungsten silicide ($WSi_x$) layer pattern 272 thermally reacts with the lateral tungsten capping layers 292 to form a crystallized tungsten silicide ($WSi_2$) layer pattern 272. Specifically, during the rapid thermal process, tungsten atoms present within the lateral tungsten capping layers 292 react with excess silicon atoms present within the silicon-rich amorphous tungsten silicide ($WSi_x$) layer pattern 272 to additionally form a new crystallized tungsten silicide ($WSi_2$) layer pattern, leading to an increase in the thickness of the crystallized tungsten silicide ($WSi_2$) layer pattern 272 constituting the gate stacks 300 and a reduction in the total resistance of word lines.

As apparent from the foregoing description, according to the method of the invention, a silicon-rich amorphous tungsten silicide layer is formed, lateral tungsten capping layers are formed on sides of the tungsten silicide layer, followed by a rapid thermal process to crystallize the tungsten silicide layer, during which a thermal reaction is caused between the silicon-rich amorphous tungsten silicide layer and the lateral tungsten capping layers. Therefore, the method of the invention provides advantages in that an increase in the resistance of word lines is inhibited and the operating characteristics of the final semiconductor device are improved.

Although the invention has been described in detail with reference to preferred embodiments thereof, it will be understood by those skilled in the art that these embodiments do not serve to limit the invention and therefore various modifications are possible within the scope and spirit of the invention as recited in the accompanying claims.

What is claimed is:

1. A method for fabricating a semiconductor device, comprising the steps of:

forming trenches for a recessed channel in an active area of a semiconductor substrate;

forming a gate insulating layer on the semiconductor substrate having the trenches;

forming a gate conductive layer on the entire surface of the resulting structure so that the trenches are buried;

sequentially forming a silicon-rich amorphous metal silicide layer and a gate hard mask on the gate conductive layer;

patterning the gate hard mask and the silicon-rich amorphous metal silicide layer until upper portions of the gate conductive layer are removed by a predetermined thickness;

forming a metal layer on the entire surface of the patterned structure;

blanket etching the metal layer to remove portions of the metal layer and to sequentially remove exposed portions of the gate conductive layer and exposed portions of the gate insulating layer, leaving lateral metal capping layers on sides of the silicon-rich amorphous metal silicide layer and forming patterned gate stacks; and conducting the thermal treatment of the silicon-rich amorphous metal silicide layer constituting the gate stacks to form a crystallized metal silicide layer.

2. The method of claim 1, wherein the trenches for a recessed channel have a depth of about 1,000 Å to about 1,500 Å.

3. The method of claim 1, wherein the gate insulating layer has a thickness of about 30 Å to about 50 Å, the gate conductive layer is formed of a polysilicon layer having a thickness of about 500 Å to bout 1,000 Å, the silicon-rich amorphous metal silicide layer is formed of a silicon-rich amorphous tungsten silicide layer having a thickness of about 1,000 Å to about 1,300 Å, and the gate hard mask has a thickness of about 2,000 Å to about 2,500 Å.

4. The method of claim 1, wherein the upper portions of the gate conductive layer are removed by a thickness of about 100 Å to about 300 Å when the gate hard mask and the silicon-rich amorphous metal silicide layer are patterned.

5. The method of claim 1, comprising forming the metal layer of a tungsten layer having a thickness of about 50 Å to about 100 Å.

6. The method of claim 1, comprising conducting the thermal treatment by a rapid thermal process.

7. The method of claim 6, comprising carrying out the rapid thermal process in a nitrogen ($N_2$) atmosphere at about 700° C. to about 1,000° C.

* * * * *